US011422577B1

(12) United States Patent
Cai

(10) Patent No.: US 11,422,577 B1
(45) Date of Patent: Aug. 23, 2022

(54) OUTPUT REFERENCE VOLTAGE

(71) Applicant: Micron Technology, Inc., Boise, ID (US)

(72) Inventor: Liuchun Cai, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/382,494

(22) Filed: Jul. 22, 2021

(51) Int. Cl.
G05F 1/46 (2006.01)
G05F 3/24 (2006.01)
G05F 3/30 (2006.01)

(52) U.S. Cl.
CPC ............ *G05F 1/461* (2013.01); *G05F 1/468* (2013.01); *G05F 3/242* (2013.01); *G05F 3/30* (2013.01)

(58) Field of Classification Search
None
See application file for complete search history.

(56) References Cited

U.S. PATENT DOCUMENTS

| 5,453,679 | A | 9/1995 | Rapp | |
|---|---|---|---|---|
| 6,906,581 | B2 | 6/2005 | Kang | |
| 7,113,025 | B2 | 9/2006 | Washburn | |
| 7,652,538 | B2* | 1/2010 | Choi | H03F 3/45475 330/292 |
| 9,612,606 | B2 | 4/2017 | Horng | |
| 10,331,151 | B1* | 6/2019 | Chu | G05F 3/30 |
| 10,613,572 | B1* | 4/2020 | Chu | G05F 3/30 |
| 11,049,576 | B1* | 6/2021 | Cai | G11C 16/34 |
| 2011/0037451 | A1 | 2/2011 | Shiina | |

* cited by examiner

*Primary Examiner* — Jeffery S Zweizig
(74) *Attorney, Agent, or Firm* — Brooks, Cameron & Huebsch, PLLC

(57) ABSTRACT

An example apparatus can be a low voltage bandgap circuit that includes a bandgap core portion. The bandgap core portion includes an operational amplifier (op-amp). The op-amp includes a PMOS input and an NMOS input. Further, the op-amp is a folded cascode op-amp. The bandgap core portion further includes a first diode coupled to the op-amp. The bandgap core portion further includes a second diode coupled to the op-amp through a resistor.

20 Claims, 6 Drawing Sheets

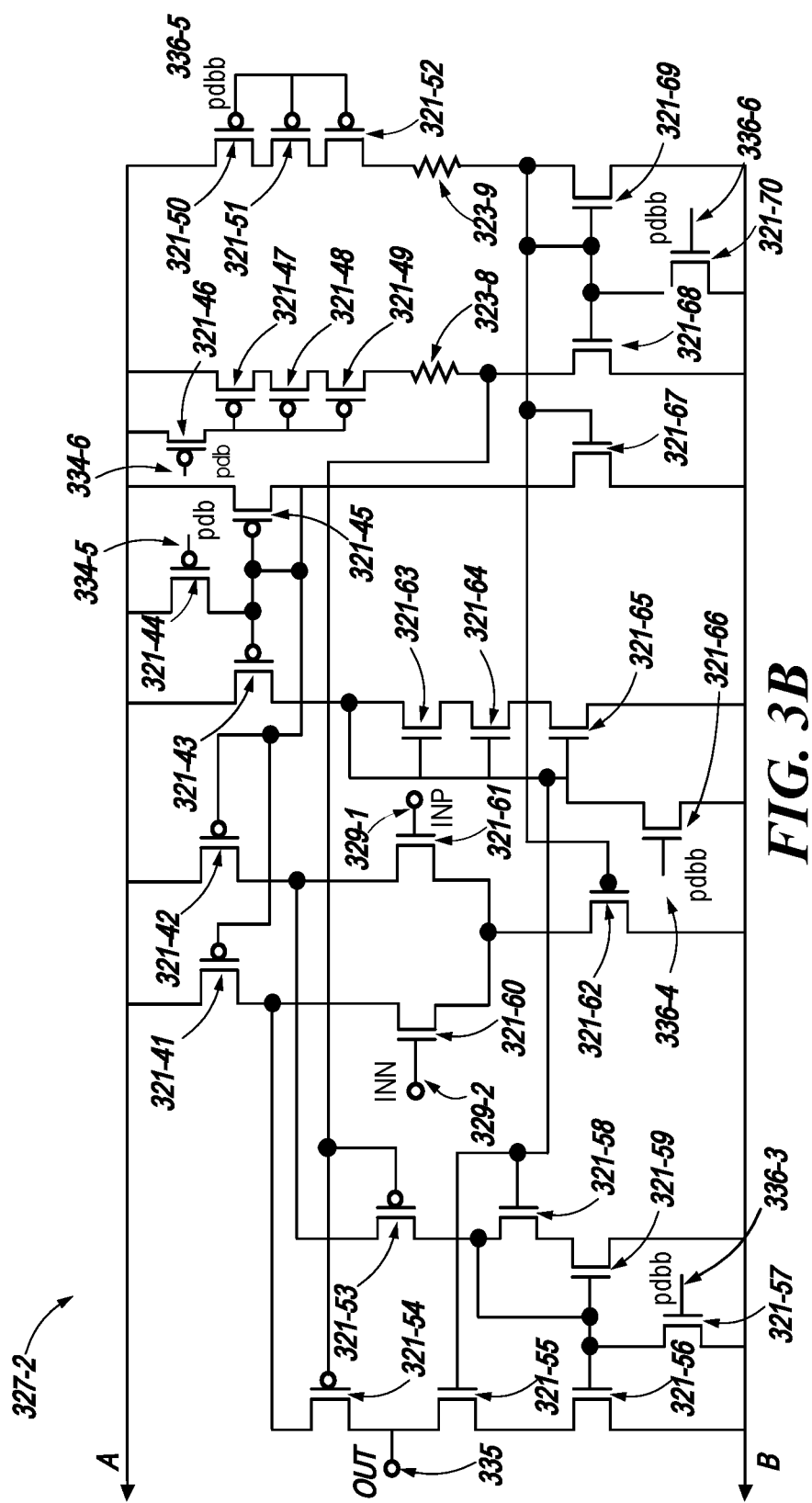
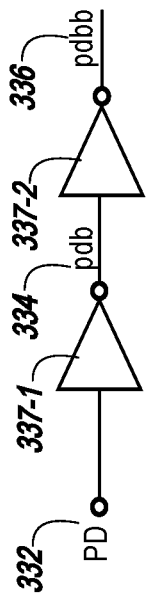
FIG. 3B
FIG. 3C

```
441 ─┐
      ▼
┌─────────────────────────────────────────────────────┐
│ INPUT A FIRST SIGNAL FROM A FIRST DIODE TO AN       │── 443
│ OPERATION AMPLIFIER (OP-AMP)                        │
└─────────────────────────────────────────────────────┘
                         │
┌─────────────────────────────────────────────────────┐
│ INPUT A SECOND SIGNAL FROM A SECOND DIODE TO THE OP-AMP │── 445
└─────────────────────────────────────────────────────┘
```

*FIG. 4*

```
551 ─┐
      ▼
┌─────────────────────────────────────────────────────┐
│ INPUT A FIRST SIGNAL FROM A FIRST DIODE TO AN       │── 553
│ OPERATION AMPLIFIER (OP-AMP)                        │
└─────────────────────────────────────────────────────┘
                         │
┌─────────────────────────────────────────────────────┐
│ INPUT A SECOND SIGNAL FROM A SECOND DIODE TO THE OP-AMP │── 555
└─────────────────────────────────────────────────────┘
                         │
┌─────────────────────────────────────────────────────┐
│ INPUT A CONTROL SIGNAL TO A LOW-VOLTAGE BANDGAP CIRCUIT │── 557
└─────────────────────────────────────────────────────┘
                         │
┌─────────────────────────────────────────────────────┐
│ OUTPUT A TEMPERATURE INSENSITIVE LOW VOLTAGE REFERENCE │── 559
└─────────────────────────────────────────────────────┘
```

OUTPUT REFERENCE VOLTAGE

TECHNICAL FIELD

Embodiments of the disclosure relate generally to electronic systems, and more specifically, relate to output reference voltage.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices. The memory sub-system can use an output reference voltage to operate a memory device.

BRIEF DESCRIPTION OF THE DRAWINGS

The present disclosure will be understood more fully from the detailed description given below and from the accompanying drawings of various embodiments of the disclosure.

FIG. 3B illustrates an example folded cascode with NMOS inputs associated with an output reference voltage circuit in accordance with some embodiments of the present disclosure.

FIG. 3C illustrates an example number of invertors coupled to the folded cascode with PMOS inputs and NMOS inputs in accordance with some embodiments of the present disclosure.

FIG. 4 is a flow diagram corresponding to a method for operating an output reference voltage circuit in accordance with some embodiments of the present disclosure.

FIG. 5 is a flow diagram corresponding to a method for operating an output reference voltage circuit in accordance with some embodiments of the present disclosure.

DETAILED DESCRIPTION

Figure 1:
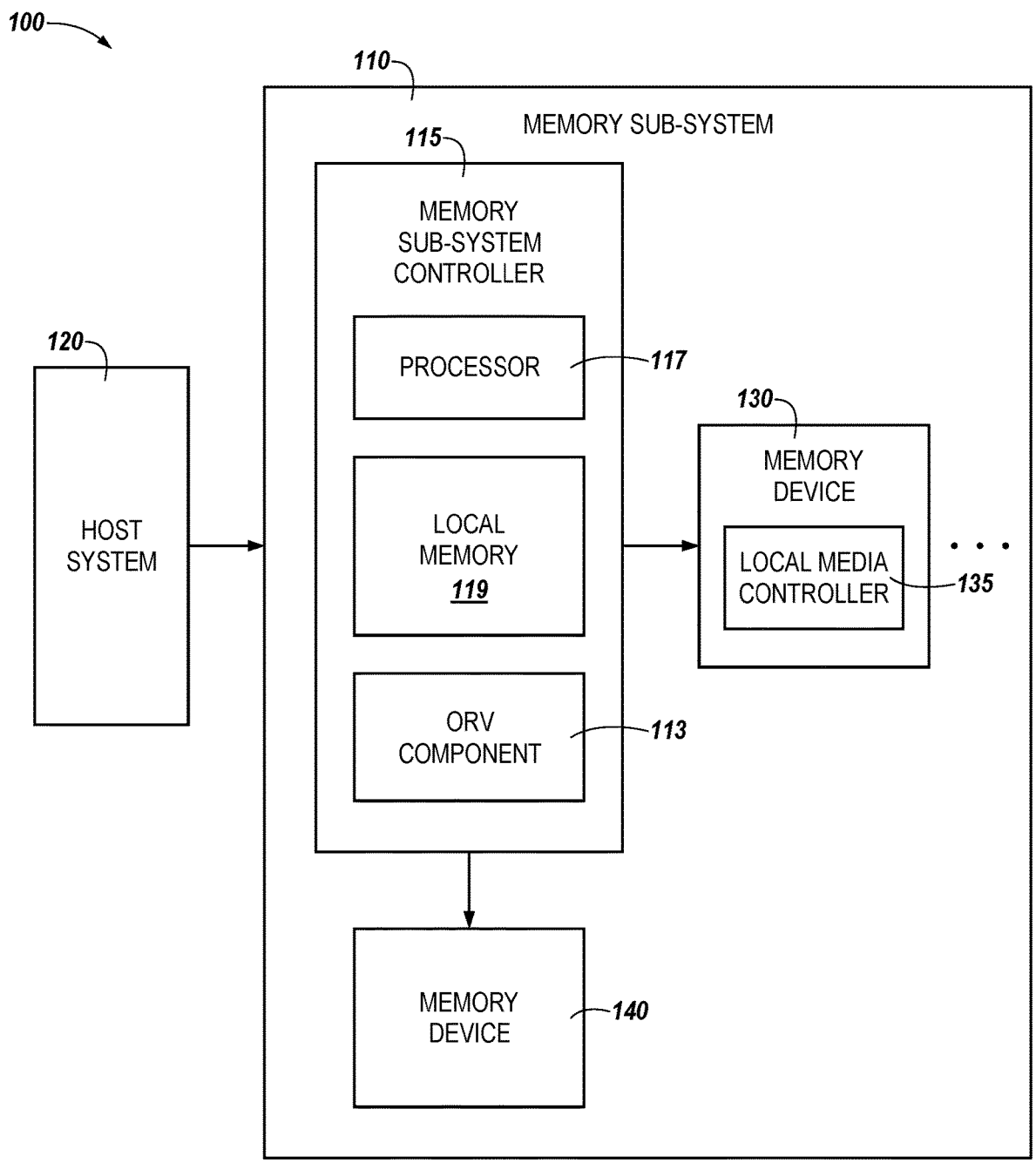
FIG. 1 illustrates an example computing system that includes an output reference voltage in accordance with some embodiments of the present disclosure.

Aspects of the present disclosure are directed to an output voltage reference circuit, in particular to memory sub-systems that include a memory sub-system output reference voltage component used to provide a low voltage temperature insensitive reference for a memory sub-system. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

During operation of a memory sub-system, an output reference voltage (ORV) can be a low voltage bandgap output reference voltage that can be generated by an ORV circuit (or low voltage bandgap (LVB) circuit) used in memory sub-systems, such as an integrated circuit. The LVB circuit of the memory sub-system can generate a fixed (e.g., constant) output voltage reference regardless of power supply variations, temperatures changes, or circuit loading from a device. In one previous example, the output voltage reference can have an output voltage around 1.25 volts, which can be equal to a silicon energy gap. Output reference voltage circuits (or generators) can be used in digital and/or mixed signal integrated circuits such as phase locked loop (PLL), flash memories and low dropout (LDO), and/or data converters.

With supply voltage scaling down in memory systems and the increasing demand for low power portable devices, the dynamic range of the memory sub-system can become smaller and smaller. However, such an output voltage (or bandgap) reference circuit may not be usable when the scaling supply voltage is close to one (1) volt. To overcome this limitation, as is described below, a low voltage bandgap (LVB) circuit can be based on a current that increases with decreasing temperature, e.g., is inversely proportional to absolute temperature (inverse PTAT) and/or a current that increases with increasing temperature, e.g., is proportional to absolute temperature (PTAT) which both can be passed through a resistor to form a temperature insensitive low reference voltage. Aspects of the present disclosure address the above and other deficiencies by providing a low voltage bandgap-based reference voltage with minimum variation in relation to the process, voltage, and/or temperature associated with the bandgap circuit. In a bandgap reference voltage, a voltage difference between two p-n junctions (e.g., diodes or bi-polar junction transistors (BJT)) can be operated at different current densities to generate a current that is PTAT in a resistor. Further, an operational amplifier ("op-amp") used in the ORV circuit can be a folded cascode type op-amp with a PMOS inputs and NMOS inputs, as will be described further below in association with FIG. 3A-3C below.

An op-amp is referred to as a folded cascode type op-amp due to the op-amp including a folding down n-channel cascode active loads of a different-pair and the associated MOSFET is changed to the p-channel. This folded topology of the op-amp allows the input common-mode level to be close to the power supply voltage as well as providing a high output swing, wide input common-mode range and preferably generates a low voltage supply circuit. Further, in some examples, a folded cascode op-amp can be a single-pole op-amp with a large output swing and have a higher gain compared to a non-folded op-amp. This can allow for a deep negative feedback because of its small signal gain that can be very large. Input and output can be short circuited to make it easier for selection of input common-mode level due to its relatively large output swing. The input common-mode level can be close to the power supply by using a folded cascode op-amp. By using an NMOS input, the common-mode level of the gate pole can reach VDD, while a PMOS input can lower the input common-mode level to 0 volts.

FIG. 1 illustrates an example computing system 100 that includes an output reference voltage (ORV) component 113 in accordance with some embodiments of the present disclosure. The computing system 100 includes a memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative- and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative- or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include an output reference voltage ("ORV") component 113. Although not shown in FIG. 1 so as to not obfuscate the drawings, the ORV component 113 can include various circuitry, such as a low voltage bandgap circuit, to facilitate inputting a first signal from a first diode to an operation amplifier (op-amp) and inputting a second signal from a second diode to the op-amp. In some embodiments, the ORV component 113 can include a special purpose circuitry in the form of an ASIC, FPGA, state machine, and/or other logic circuitry that can allow the ORV component 113 to orchestrate and/or perform operations to selectively generate a low voltage output reference for the memory device 130 and/or the memory device 140.

In some embodiments, the memory sub-system controller 115 includes at least a portion of the ORV component 113. For example, the memory sub-system controller 115 can include a processor 117 (processing device) configured to execute instructions stored in local memory 119 for performing the operations described herein. In some embodiments, the ORV component 113 is part of the host system 110, an application, or an operating system.

In a non-limiting example, an apparatus (e.g., the computing system 100) can include a memory sub-system ORV component 113. The memory sub-system ORV component 113 can be resident on the memory sub-system 110. As used herein, the term "resident on" refers to something that is physically located on a particular component. For example, the memory sub-system ORV component 113 being "resident on" the memory sub-system 110 refers to a condition in which the hardware circuitry that includes the memory sub-system ORV component 113 is physically located on the memory sub-system 110. The term "resident on" may be used interchangeably with other terms such as "deployed on" or "located on," herein. The memory sub-system ORV component 113 can be configured to generate a low voltage bandgap reference for use by the memory sub-system 110. The low voltage bandgap reference can be a fixed or constant voltage regardless or independent of power supply variations, temperature changes or fluctuations, or a circuit load of a memory device.

In another non-limiting example, a system (e.g., the computing system 100) can include a memory sub-system 110 including memory components arranged to form a stackable cross-gridded array of memory cells. A processing device (e.g., the processor 117 and/or the local media controller 135) can be coupled to the memory components and can perform operations including generating the low voltage bandgap reference.

Figure 2:
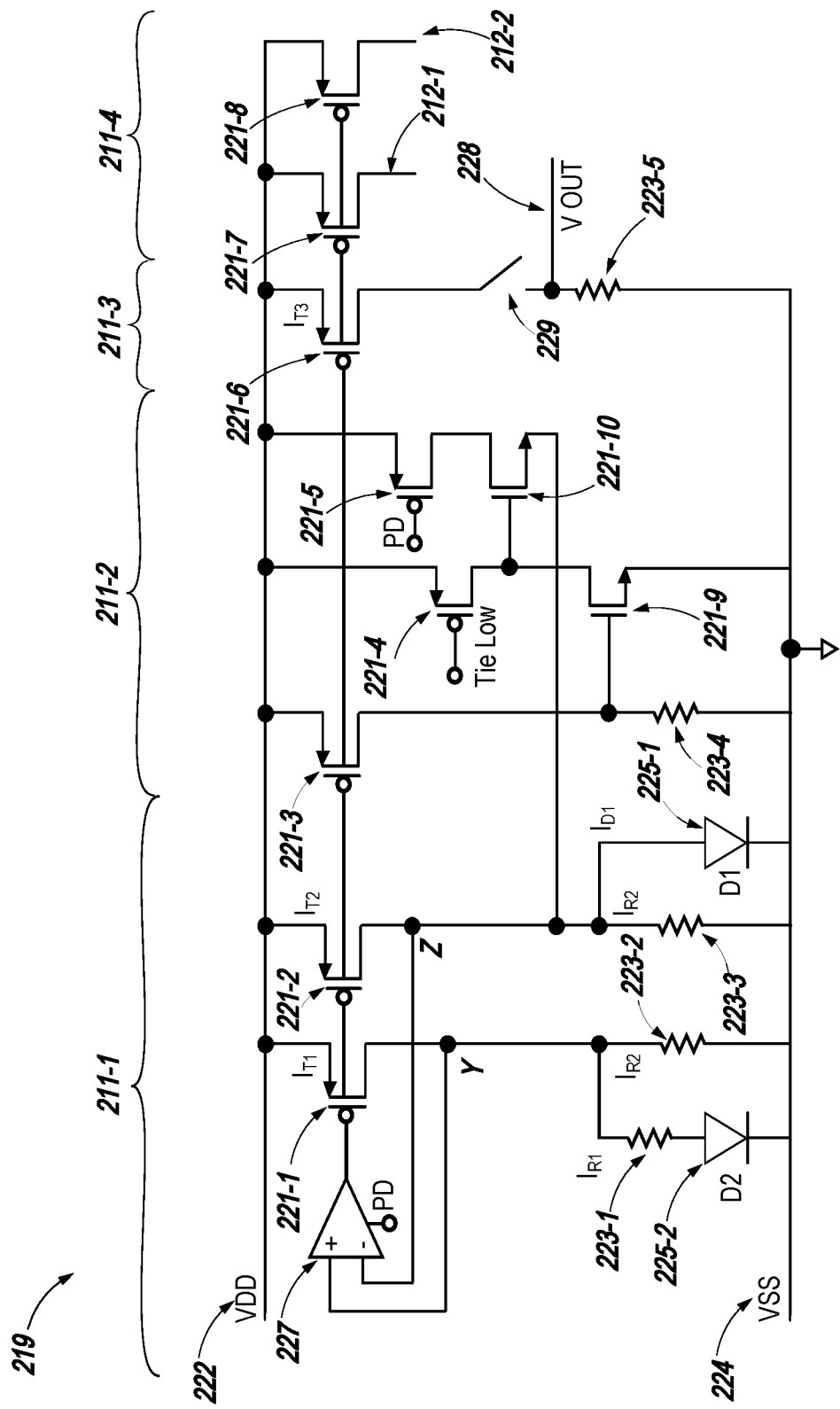
FIG. 2 illustrates an example output reference voltage circuit in accordance with some embodiments of the present disclosure.

FIG. 2 illustrates an example output reference voltage (ORV) circuit 219 in accordance with some embodiments of the present disclosure. While illustrated as including all of the elements of FIG. 2, the examples of the ORV circuit 219 are not so limited. For example, any portion of the elements of FIG. 2 capable of performing the operations for generation of the ORV described below can be referred to as the ORV circuit 219. Further, while an example of a memory sub-system is provided herein, examples of the ORV circuit can be used within systems more broadly than this context. Further, the ORV circuit 219 can be within an ORV component, such as ORV component 113 in FIG. 1.

In the illustrated example of FIG. 2, the ORV circuit 219 comprises a number of transistors 221-1 to 221-10 (hereinafter collectively referred to as transistors 221), diodes 225-1, 225-2, an operation amplifier ("op-amp") 227, resistors 223-1 to 223-5, a VDD (e.g., supply voltage) 222, a Vss (e.g., voltage source supply or ground) 224, and an output voltage 228. In some examples, the VDD 222 can be a low voltage supply. For example, the voltage can be from 1.08 volts (V) to 1.32 V and the temperature can range from −40 degrees Celsius to 150 degrees Celsius. The ORV circuit 219 can be a reference voltage generator used in DRAM memory devices, flash memories, and/or analog devices.

The reference voltage can be generated such that the reference voltage is stabilized over process, voltage, and temperature variations, and also can be implemented without modification of the fabrication process. In some memory applications, the demand for low-power and low-voltage operation is increasing the spread of battery-operated portable memory applications. The output voltage of one example of a bandgap reference (BGR) can be 1.25 volts, which can be similar to the same voltage as the bandgap of silicon. This fixed output voltage of 1.25 V limits the low Vcc operation. This functions to allow a BGR that can successfully operate with a sub-1-V supply. The ORV circuit 219 can include a bandgap core portion 211-1, a bandgap start-up circuit portion 211-2, an output voltage portion 211-3, and an output current source portion 211-4. In the example illustrated in FIG. 2, the bandgap core portion 211-1 includes the op-amp 227, the transistors (D1) 221-1, (D2) 221-2, the diodes 225-1, 225-2, and the resistors 223-1 (R1), 223-2 (R2), 223-3 (R2). The bandgap start-up circuit portion 211-2 includes transistors 221-3, 221-4, 221-5, 221-9, 221-10, and the resistor 223-4 (R3). The output voltage portion 211-3 includes the transistor 221-6, the resistor 223-5 (R5), the switch 229, and the voltage output (V OUT) 228. The output current source portion 211-4 includes the transistors 221-7, 221-8, and the current sources 212-1, 212-2.

In one example, a feedback loop can be formed by the op-amp 227 and the transistors 221-1 and 221-2, which can maintain the voltages at the drain regions of transistor 221-1 (labeled "Y") and transistor 221-2 (labeled "Z") in a matched and equal state in relation to the forward voltage drop (Vbe1) across diode 225-1, which is inversely proportional to absolute temperature (IPTAT). In this example, "Vbe" can represent a base-emitter threshold voltage to operate a P-N junction. The voltage across the resistor 223-1 is equal to the difference (Vbe1−Vbe2) between a forward bias voltage (Vbe1) of diode 225-1 and a forward bias voltage (Vbe2) of diode 225-2, which is proportional to absolute temperature (PTAT). The equal currents of transistors 221-1 and 221-2 transistors and matched resistors 223-2 and 223-3 can ensure that the current through the diodes 225-1 and 225-2 differs by the ratio N (the ratio of the current through the diode 225-2 to the current through the diode 225-1). Here, currents through transistor 221-1 and transistor 221-2 are equal. So, the difference in voltage drop across the diodes 225-1 and 225-2, designated as dVbe (Vbe1−Vbe2)=KT/q ln(N), where K is Boltzmann's constant (1.38×10$^{-23}$ J/K), T is absolute temperature (measured in degrees Kelvin), and q is the charge of an electron (1.6×10$^{19}$ C). The IPTAT Vbe1 associated with diode 225-1 and PTAT dVbe associated with diode 225-2 can be converted into the current, given as the following:

$$I_{T1} = I_{T2} \quad (1)$$

$$I_{T1} = I_{R1} + I_{R2} \quad (2)$$

$$I_{T2} = I_{D1} + I_{R2} \quad (3)$$

$$I_{T1} = I_{R1} + I_{R2} = dVbe/R1 + Vbe/R_2 \quad (4)$$

$$I_{T1} = (KT/q)(\ln(N)/R_1 + Vbe/R_2 \quad (5)$$

$$I_{T1} = I_{T3} \text{(current mirror)} \quad (6)$$

$$V_{out} = I_{T3} * R_5 = I_{T1} * R_5 = [(KT/q)(\ln(N)/R_1 + Vbe/R_2] * R_5 \quad (7)$$

The term $(KT/q)(\ln(N)/R_1$ is the positive temperature coefficient and the term $Vbe/R2$ is the inverse temperature coefficient. The values N, $R_1$, and $R_2$ are chosen to ensure that the positive temperature coefficient is precisely cancelled by the inverse temperature coefficient. The value of $R_5$ can be chosen to scale the actual value of reference voltage $V_{out}$.

Sources 212-1 and 212-2 can cause variation of the reference voltage including an op-amp offset, a mismatch in the current transistors 221-1, 221-2, the diodes 225-1, 225-2, and/or the resistors 223. The proposed reference voltage $V_{out}$ 228 is determined by the ratio of R1, R2, and R5 from the above final formula (7). The variation of the diodes 225-1, 225-2 is also determined by a ratio (N) instead of by each diode themselves. In some examples, the variation of the diodes 225-1, 225-2 can be controlled by a symmetrical layout. The transistors 221-1, 221-2 can be operated operate in the saturation region, so that their drain to source voltage can be a small variation when transistor sizes are increased and currents are reduced.

The most important contributors to the mismatch is the op-amp 227. When at high voltage operation (e.g., more than a voltage of 1V), these mismatch contributions from the op-amp 227 can be amplifier input pairs giving rise to input offset voltages and the matching PMOS/NMOS current sources (as will be described in further detail in association with FIGS. 3A-3B), which can be determined by increasing transistor size, such as input transistors and current source transistors. However, when the voltage is from a low supply, achieving a sufficient gain of the op-amp 227 and an adequate stability margin can become difficult. In this situation, the formula (7), described above, can be changed to the following due to the offset ($V_{os}$) from op-amp 227:

$$V_{out} = I_{T3} * R_5 = I_{T1} * R_5 = [((KT/q)(\ln(N) \pm V_{os})/R_1 + Vbe/R_2] * R_5 \quad (8)$$

In this way, a low voltage temperature insensitive bandgap output reference voltage can be achieved with a low power supply.

Figure 3A:
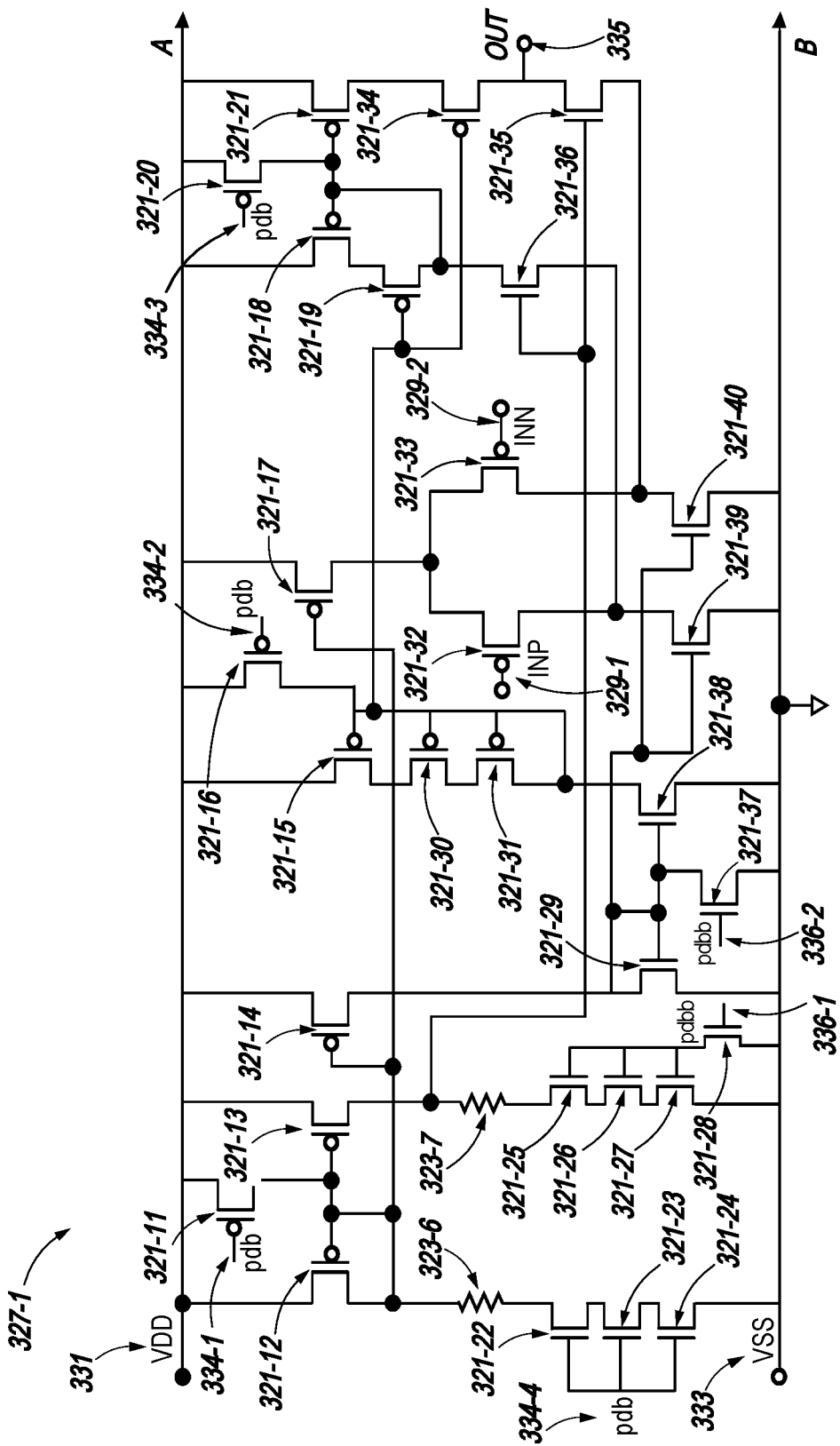
FIG. 3A illustrates an example folded cascode with PMOS inputs associated with an output reference voltage circuit in accordance with some embodiments of the present disclosure.

FIG. 3A illustrates an example folded cascode with PMOS inputs 327-1 in accordance with embodiments of the present disclosure while FIG. 3B illustrates an example folded cascode with NMOS inputs 327-2 in accordance with some embodiments of the present disclosure. The PMOS inputs of FIG. 3A are illustrated as connecting to the NMOS inputs of FIG. 3C at the points labeled "A" in relation to the top line associated with $V_{DD}$ 331. Likewise, the PMOS inputs of FIG. 3A are illustrated as connecting to the NMOS inputs of FIG. 3B at the points labeled "B" in relation to the bottom line associated with VSS 333. An op-amp (such as op-amp 227 in FIG. 2) can be a folded cascode type op-amp with the PMOS inputs 327-1 and the NMOS inputs 327-2 of FIGS. 3A-3B and with output 335.

As illustrated in FIG. 3A, the PMOS inputs are associated with a number of transistors 321-11 to 321-40, a number of resistors 323-6 to 323-7, INP and INN differential inputs 329-1, 329-2, and control signal inputs from 334-1, 334-2, 334-3, 334-4 (pdb) to 336-1, 336-2 (pdbb). The PMOS inputs portion 327-1 can have an OUT portion 335.

As illustrated in FIG. 3B, the NMOS inputs are associated with a number of transistors 321-41 to 321-70, a number of resistors 323-6 to 323-7, INP and INN differential inputs 329-1 and 329-2, and control signal inputs 334-5, 334-6 (pdb) to 336-3, 336-4, 336-5, and 336-6 (pdbb). The NMOS inputs portion 327-2 can have an OUT portion 335.

FIG. 3C illustrates an example number of invertors 337-1, 337-2 that are coupled to the folded cascode with PMOS inputs and NMOS inputs of FIGS. 3A-3B in accordance with some embodiments of the present disclosure. The number of inverters 337-1, 337-2 can have an initial input of power down (PD) 332. The first inverter 337-1 can have an output of a pdb signal 334 that is an input to the second inverter 337-2. The second inverter 337-2 can have an output of a pdbb signal 336.

In some embodiments, referring now to FIGS. 2-3C, a forward voltage drop (Vbe1) across diode 225-1 can be affected by process, voltage, and/or temperature (PVT), which is an input to the op-amp, illustrated as inputs X and Y in FIG. 2). The op-amp may need to adjust to a wide input range. In FIG. 2 described above, transistors 221-3 to 221-10 and resistor 223-4 form the start-up circuits. In this scenario, the bandgap circuit can be powered down with zero voltage across the resistors 223-2, 223-3 and when the power down (PD) 332 is asserted. In this condition, transistors 221-3, 221-9, and 221-5 are off and transistor 221-10 is on. When the PD 332 is taken low, current flows through transistors 221-5 and 221-10 driving the voltage across the diode 225-1 higher, which turns on the bandgap core portion 211-1 PMOS current sources including transistor 221-3 via the op-amp 227. When the current through the transistor 221-3 increases sufficiently, the voltage across the resistor 223-4 increases enough to turn transistor 221-9 on, causing transistor 221-10 to turn off and disable the start-up circuit portion 211-2. This bandgap-based low voltage reference circuit can provide the output reference voltage and also provide several output current sources (such as, for example, a 25.0 uA output current source).

FIG. 4 is a flow diagram 441 of a method for generation of an output reference voltage in accordance with some embodiments of the present disclosure. The flow diagram 441 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the flow diagram 441 is performed by the ORV component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 443, a first signal can be input from a first diode (such as first diode 225-1 in FIG. 2) to an operation amplifier (or "op-amp," such as op-amp 227 in FIG. 2). The first signal can be on an inverse proportional to absolute temperature (IPTAT) value. The operational amplifier can be a folded cascode op-amp that includes both a PMOS input and an NMOS input, as is described in association with FIGS. 3A-3C. At operation 445, a second signal can be input from a second diode to the op-amp. The second diode can be similar to diode 225-2 in FIG. 2.

FIG. 5 is a flow diagram 551 corresponding to a method for output reference voltage generation in accordance with some embodiments of the present disclosure. The flow diagram 551 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the flow diagram 551 is performed by the ORV component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 553, a first signal can be input from a first diode (such as first diode 225-1 in FIG. 2) to an operation amplifier (or "op-amp," such as op-amp 227 in FIG. 2). The first signal can be on an inverse proportional to absolute temperature (IPTAT) value. The operational amplifier can be a folded cascode op-amp that includes both a PMOS input and an NMOS input, as is described in association with FIGS. 3A-3C. At operation 555, a second signal can be input from a second diode to the op-amp. The second diode can be similar to diode 225-2 in FIG. 2. The second signal can be proportional to an absolute temperature (PTAT) value.

At operation 557, control signals can be input to a low-voltage bandgap circuit. The low-voltage bandgap circuit can be similar to the ORV circuit 219 of FIG. 2. In some examples, the method can include transferring the first signal and the second signal through a resistor. At operation 559, a temperature insensitive low voltage reference can be output. The output can be from an ORV circuit, such as ORV circuit 219 in FIG. 2. In some examples, the temperature insensitive low voltage reference can be less than 1.25 volts.

Figure 6:
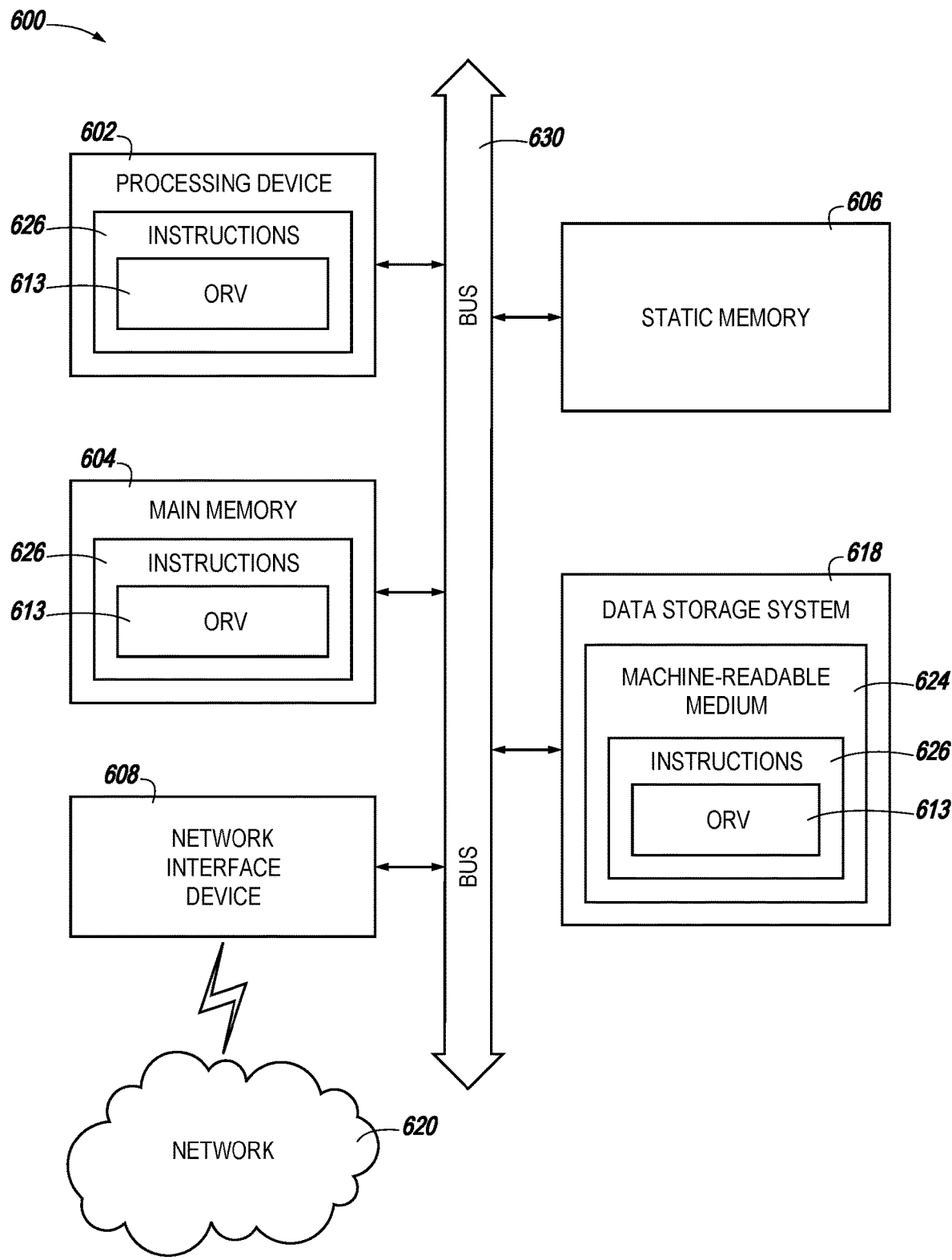
FIG. 6 is a block diagram of an example computer system in which embodiments of the present disclosure may operate.

FIG. 6 is a block diagram of an example computer system 600 in which embodiments of the present disclosure may operate. For example, FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the ORV component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an ORV component (e.g., the ORV component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
 a bandgap core portion comprising:
  an operational amplifier (op-amp), wherein:
   the op-amp comprises a PMOS input and an NMOS input; and
   the op-amp is a folded cascode op-amp;
  a first diode coupled to the op-amp; and
  a second diode coupled to the op-amp through a resistor.

2. The apparatus of claim 1, further comprising a bandgap startup circuit coupled to the bandgap core portion.

3. The apparatus circuit of claim 2, further comprising an output voltage portion coupled to the bandgap startup circuit.

4. The apparatus of claim 2, wherein an output of the bandgap core portion is an input to the bandgap startup circuit.

5. The apparatus of claim 1, wherein the PMOS input of the folded cascode op-amp comprises a number of transistors and a number of resistors.

6. The apparatus of claim 1, wherein the NMOS input of the folded cascode op-amp comprises a number of transistors and a number of resistors.

7. The apparatus of claim 1, wherein a first signal associated with the first diode is a first input to the op-amp and a second signal associated with the second diode is a second input to the op-amp.

8. An apparatus, comprising:
   a bandgap core portion comprising:
      an operational amplifier (op-amp), wherein:
         the op-amp comprises a PMOS input and an NMOS input; and
         the op-amp is a folded cascode op-amp;
      a first diode directly coupled to the op-amp; and
      a second diode coupled to the op-amp through a resistor;
   a bandgap startup circuit coupled to the bandgap core portion; and
   an output voltage portion coupled to the bandgap core portion.

9. The apparatus of claim 8, wherein the first diode and the second diode each provides an input to the op-amp.

10. The apparatus of claim 8, wherein a signal provided by the second diode to the op-amp is transferred through the resistor prior to being received at the op-amp.

11. The apparatus of claim 8, wherein an output of the output voltage portion is less than 1.25 volts.

12. The apparatus of claim 8, wherein the bandgap core portion, the bandgap startup circuit, and the output voltage portion are connected through a series of transistors.

13. The apparatus of claim 8, wherein the op-amp and a first transistor and a second transistor form a feedback loop that keeps a voltage drain of the first transistor and the second transistor equal to a voltage drop across the first diode.

14. The apparatus of claim 13, wherein the voltage drop across the first diode is inversely proportional to an absolute temperature.

15. A system, comprising:
   a memory sub-system comprising a memory array and an output reference voltage (ORV) circuit; and
   a processing device coupled to the memory-subsystem, the processing device to perform operations comprising:
      inputting a first signal from a first diode to an operational amplifier (op-amp), wherein:
         the first signal is based on an inverse proportional to absolute temperature (PTAT); and
         the op-amp is a folded cascode op-amp that comprises a PMOS input and an NMOS input; and
      inputting a second signal from a second diode through a resistor to the op-amp, wherein the second signal is proportional to absolute temperature (PTAT).

16. The system of claim 15, wherein the processing device is further to perform operations comprising inputting a control signal to a low-voltage bandgap circuit.

17. The system of claim 16, wherein the control signal controls the ORV on or off.

18. The system of claim 16, wherein the processing device is further to perform operations comprising transferring the first signal and the second signal through the resistor.

19. The system of claim 15, wherein the processing device is further to perform operations comprising outputting a temperature insensitive low reference voltage.

20. The system of claim 19, wherein the temperature insensitive low reference voltage is less than 1.25 volts.

* * * * *

UNITED STATES PATENT AND TRADEMARK OFFICE
CERTIFICATE OF CORRECTION

PATENT NO. : 11,422,577 B1
APPLICATION NO. : 17/382494
DATED : August 23, 2022
INVENTOR(S) : Liuchun Cai Page 1 of 1

It is certified that error appears in the above-identified patent and that said Letters Patent is hereby corrected as shown below:

In the Claims

Column 12, Lines 65-67 Claim 3 should read:
The apparatus of claim 2, further comprising an output voltage portion coupled to the bandgap startup circuit.

Signed and Sealed this
Twenty-fifth Day of April, 2023

Katherine Kelly Vidal
*Director of the United States Patent and Trademark Office*